United States Patent [19]

Mott

[11] Patent Number: 4,756,414
[45] Date of Patent: Jul. 12, 1988

[54] ANTISTATIC SHEET MATERIAL AND PACKAGE

[75] Inventor: Charles L. Mott, Midland, Mich.

[73] Assignee: The Dow Chemical Company, Midland, Mich.

[21] Appl. No.: 785,808

[22] Filed: Oct. 9, 1985

[51] Int. Cl.$^4$ ............................................. B65D 73/02
[52] U.S. Cl. .................................. 206/328; 428/922; 428/924
[58] Field of Search ................. 206/328; 428/922, 924

[56] References Cited

U.S. PATENT DOCUMENTS

| | | |
|---|---|---|
| 3,576,649 | 4/1971 | Brazier . |
| 4,154,344 | 5/1979 | Yenni, Jr. et al. . |
| 4,156,751 | 5/1979 | Yenni, Jr. et al. . |
| 4,208,696 | 6/1980 | Lindsay et al. ..................... 428/922 |
| 4,231,901 | 11/1980 | Berbeco . |
| 4,407,872 | 10/1983 | Horii . |
| 4,424,900 | 1/1984 | Petcavich . |
| 4,438,176 | 3/1984 | Steiner et al. . |
| 4,471,872 | 9/1984 | Dedow . |
| 4,480,747 | 11/1984 | Kazor et al. . |
| 4,496,406 | 1/1985 | Dedow . |
| 4,557,379 | 12/1985 | Lane et al. .......................... 206/328 |
| 4,610,353 | 9/1986 | Young ................................. 206/328 |

FOREIGN PATENT DOCUMENTS 2156362A 3/1985 United Kingdom .

OTHER PUBLICATIONS

Metallized Products brochure, "Staticure-Metallized Products Radiation Cured Static Control Products" (undated).

Mar. 1985, Converting Magazine, "EB-Curable Coating is Clear Cure for Static", Sep. 1985, Evaluation Engineering, Electron Beam Radiation Cured Coatings for Static Control.

Primary Examiner—Joseph Man-Fu Moy
Attorney, Agent, or Firm—L. E. Hessenaur, Jr.

[57] ABSTRACT

A flexible sheet material and package formed therefrom is provided. The multilayer sheet material includes a first flexible heat sealable plastic material with antistatic properties on at least the one major surface thereof which first layer is laminated to a second flexible plastic material with an electrically conductive material on the one major surface thereof and antistatic properties on the other major surface thereof.

26 Claims, 1 Drawing Sheet

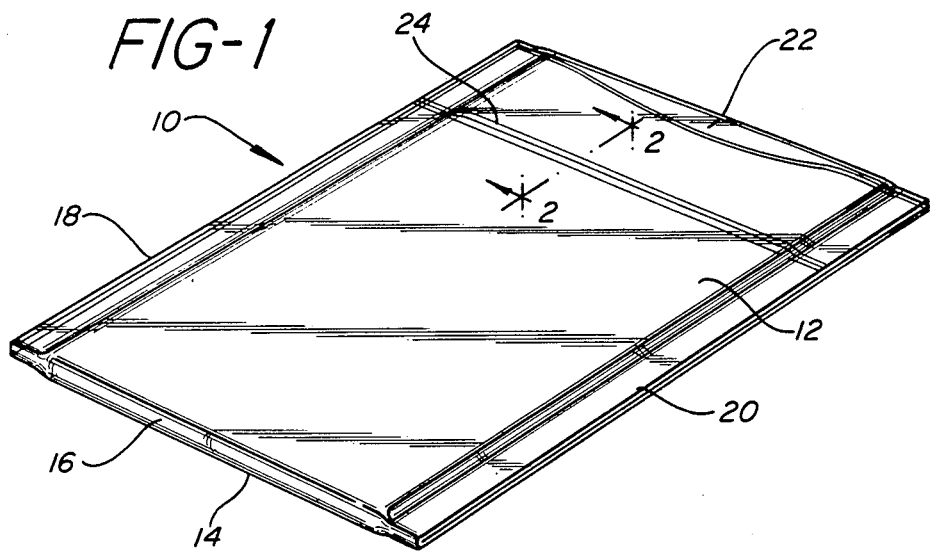
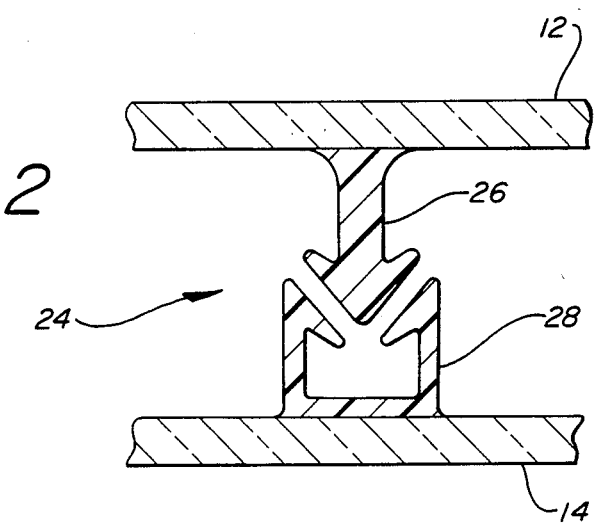
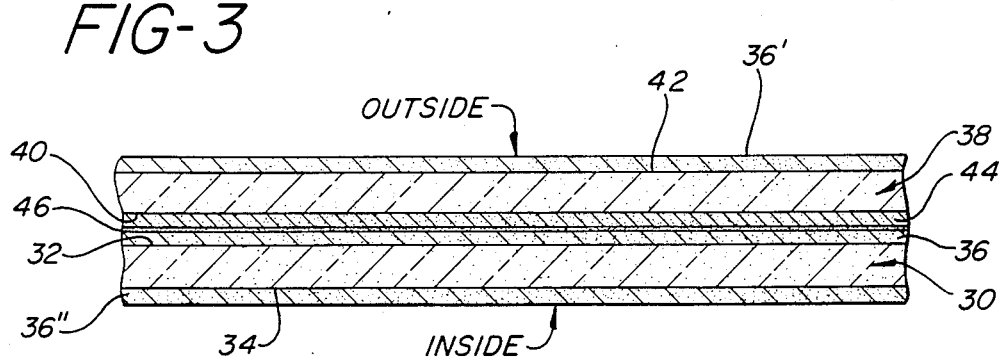

ANTISTATIC SHEET MATERIAL AND PACKAGE

BACKGROUND OF THE INVENTION

This invention relates to flexible sheet materials used for forming packages or the like for containing electrostatically sensitive components and protecting them from potentially damaging electrostatic charges, and also relates to packages formed therefrom.

As electronic components and units have become increasingly more complex, while achieving ever smaller dimensions, the problem of damage to such components due to electrostatic discharge has become of major concern. The buildup of electrostatic charges on the packages for such components can result in the discharge of a spark which can arc over or otherwise damage or destroy the components.

Similarly, the medical and pharmaceutical industries have requirements for ultraclean instruments and drug substances. Packaging of such instruments and drugs is a problem because buildup of electrostatic charges on the packaging materials attracts dust and other contaminants from the air and surroundings. Such contaminants may become mixed with the chemicals or drugs causing purity problems. Likewise, when the package is opened or the product poured out a static charge is generated on the product which may attract contaminates.

Accordingly, a number of packages and packaging materials have been developed which have antistatic properties. These antistatic packages have found wide use in a number of industries including the aerospace, chemical and pharmaceutical, and computer and electronics industries. Such packages are designed to prevent the buildup of electrostatic charges on the product contained therein, and may also be designed to provide protection against external electric fields.

For example, many packages have been fabricated of plastic films or sheets compounded with or coated with antistatic additives such as quaternary amines, amine salts or soaps, polyethylene glycols or ethers, and the like. These agents act as humectants, absorbing moisture from the air, to reduce friction within the package and static charge buildup on the package. However, such antistatic agents may not be permanent (i.e., may migrate to the surface and be lost from the plastic) and are humidity dependent.

Other packages have included one or more layers of conductive material to form a protective envelope or Faraday cage-type structure about the product. A Faraday cage may be defined as an electrostatic shield composed of a continuous mesh or series of interconnected electrical conductors which surrounds a defined volume of space. Examples of packages utilizing conducting layers include Yenni Jr., et al, U.S. Pat. Nos. 4,154,344 and 4,156,751; Petcavich, U.S. Pat. No. 4,424,900; and Dedow, U.S. Pat. Nos. 4,471,872 and 4,496,406.

However, some of these packages have no provision for closing the package, which leaves the Faraday cage protection incomplete. If adhesive tape or the like is used to close such packages, the act of stripping off the tape to reopen the package may itself create a static charge which is potentially damaging to the contents of the package. Moreover, normal flexing and handling of some prior art packages having conductive layers causes portions of the conductive layers to flake off. These flakes of material themselves are potential sources of contamination to the contents of the packages.

Accordingly, the need still exists in the art for a flexible packaging material and package which has permanent antistatic properties and which protects the contents thereof both from electrostatic charge buildup within the package as well as from external electrical fields and which has a closure means to complete the Faraday cage.

SUMMARY OF THE INVENTION

The present invention meets that need by first providing a flexible sheet material which may be formed into a package for protecting electrostatically sensitive electronic components as well as sensitive chemicals, ultraclean instruments or other materials for which the buildup of electrostatic charges may cause contamination or damage problems. For the purposes of this specification, reference to electrostatically sensitive components will include not only electronic parts and devices, but also sensitive chemicals and pharmaceuticals as well as other materials or instruments which have the potential of being damaged or contaminated by an electrostatic buildup or discharge.

According to one aspect of the present invention, a multilayer flexible sheet material is provided which includes a first layer of a flexible heat sealable plastic material having primary and secondary major surfaces. Antistatic properties are present on at least the secondary major surface of this layer. The sheet material also includes a second layer of flexible plastic also having primary and secondary major surfaces. An electrically conductive material is on the primary major surface and antistatic properties are present on at least the secondary major surface of this second layer. The layers are bonded together along their respective primary major surfaces, preferably with a suitable adhesive.

The flexible sheet material can be readily formed into a package either by folding a sheet onto itself and heat sealing the opposing edges or superimposing two sheets and sealing the opposing edges. Additionally, a closure device may be attached to or incorporated in the package. A preferred closure means is a releasable interlocking plastic zipper, the opposing rib and groove elements of which may be laminated to opposing inner faces of the sheet material adjacent the open end of the package.

A preferred method for fabricating the package includes the steps of providing a first layer of a flexible heat sealable plastic material having primary and secondary major surfaces and coating the primary major surface with an antistatic material which comprises an acrylate monomer-oligomer mixture containing an alkylether triethyl ammonium sulfate. The antistatic material is cured by exposure to an electron beam. A second layer of flexible plastic material is also provided which has primary and secondary major surfaces. An electrically conductive material such as a metal is deposited on the primary major surface. This deposition may be carried out using well known vacuum deposition or sputtering techniques. Alternatively, a number of conductive materials in sheet or web form are readily commercially available and may be used.

The first and second layers of the flexible sheet are joined together along their respective primary major surfaces by coating one or both of these surfaces with a thermosetting adhesive and pressing the first and second layers together. The thermosetting adhesive is then cured by exposing it to an electron beam. Surprisingly, curing by exposure to an electron beam causes both exterior facing surfaces of the multilayer flexible sheet material to possess the effect of antistatic properties. This phenomenon occurs both during the initial curing of the antistatic material and again during electron beam curing of the adhesive. Alternatively, the antistatic material and adhesive material may be blended together and applied to one or both of the primary major faces of the first and second layers and cured simultaneously by exposure to an electron beam; although, it has been found that such a system does not produce as good a result (in terms of the strength of the antistatic properties on both secondary major surfaces) as does the preferred process.

The flexible sheet material and process for making it provide a flexible packaging material and package which has permanent antistatic properties on both the interior and exterior facing surfaces of a package. The metal layer is embedded in the multilayer structure and cannot flake off or peel when the package is flexed and provides a Faraday cage to protect the contents of the package from external electric fields. The optional zipper closure means, which may also contain an antistatic agent and/or semiconductive filler, secures the contents of the package from accidental spillage and brings the opposing faces of the open end of the package into close physical contact which enhances the Faraday cage protection. The result is a package which has permanent antistatic properties, is non-volatile, non-sluffing, non-humidity dependent, and otherwise offers a number of advantages over pre-existing antistatic packages.

Accordingly, it is an object of the present invention to provide a flexible sheet material, package, and process for making which has permanent antistatic properties and protects the contents of the package from both electrostatic charge buildup within the package as well as from external electric fields. This and other objects and advantages of the invention will become apparent from the following detailed description, the accompanying drawings, and the appended claims.

BRIEF DESCRIPTION OF THE DRAWINGS

FIG. 1 is a perspective view of a package formed in connection with the teachings of the present invention;

FIG. 2 is a cross-sectional view taken along line 2—2 in FIG. 1 illustrating in detail the optional zipper closure for the package; and FIG. 3 is an enlarged cross-sectional view through the sheet material used to form the package of FIG. 1.

DETAILED DESCRIPTION OF THE PREFERRED EMBODIMENTS

Referring now to FIG. 1, there is illustrated a package 10 which is the preferred form of package formed in accordance with the present invention. Other package, bag, pouches, and forms, including thermoformed containers and laminated containers, may be prepared from the flexible sheet material of the present invention. Package 10 is shown as generally rectangular in shape, but may be formed into any convenient shape or size depending on the component or material to be contained therein. Package 10 includes two opposing walls 12 and 14 which comprise the multilayer flexible sheet material of the present invention described in greater detail below. In the preferred embodiment, package 10 is formed by applying releasable and reclosable closure 24 to a web of the flexible sheet material, and folding the web of the flexible sheet material upon itself at fold line 16 to bring complementary rib and groove elements 26 and 28 into alignment. Opposing edges 18 and 20 are then heat sealed together and packages 10 severed from the web in a conventional manner.

As best illustrated in FIG. 2, closure 24, adjacent opening 22, comprises an interlocking zipper having complimentary rib and groove elements 26 and 28, respectively. While single rib and groove elements have been illustrated for simplicity, it will be apparent to those skilled in the art that other structures such as so-called Wide Track zippers with a plurality of complimentary rib and groove elements may be used as described in Published British Patent Application No. 2,133,462 published July 25, 1984. Optional closure 24 is preferably extruded or laminated onto the sheet material prior to the formation of package 10. Preferably, an antistatic material and/or semiconductive filler is incorporated into closure 24.

Closure 24 may be used to enhance the Faraday-cage effect of the package by providing a electrical path through the zipper to opposite walls of the package. Preferably, closure 24 has a surface resistivity in the range of from about $10^{13}$ to about $10^2$ ohms/sq. Closure 24 is located approximately 0.24 to 4 inches, and preferably 0.5 to 1.5 inches, from open end 22 of package 10. Closure 24 may be omitted, or alternate closure means used, if so desired.

The multilayer flexible sheet material of the present invention which is used to form walls 12 and 14 of package 10 is illustrated in enlarged cross section in FIG. 3. The legends "Inside" and "Outside" have been added to the drawing to aid in the understanding of the invention. The side of the material labeled "Inside" is the inwardly facing surface of the material designed to be in contact with the contents of package 10 which is formed as described above. The "Inside" may also have closure 24 applied to it as illustrated in FIG. 2. The side of the material labeled "Outside" is the exterior or outwardly facing surface of the multilayer material.

The sheet material is formed by the lamination of two principal layers. First layer 30 is formed of a flexible heat sealable plastic having primary and secondary major surfaces 32 and 34, respectively. First layer 30 has an antistatic material 36 on its primary major surface 32. First layer 30 also has antistatic properties (illustrated by numeral 36") on at least secondary major surface 34. By "antistatic" material or agent, it is meant that the material or agent has properties which prevent the buildup of or cause the dissipation of static charges. Antistatic material 36 provides a surface conductivity in the range from about $10^6$ to about $10^{13}$ ohms/sq., and preferably about $10^8$ to about $10^{11}$ ohms/sq.

The preferred antistatic material for use in the present invention is an acrylate monomer-oligomer mixture containing an alkylether triethyl ammonium sulfate available from Household Manufacturing Inc.'s Metallized Products Division, Winchester, Mass., under the name Staticure. The material is curable by exposure to an electron beam and cures to a permanent, nonbleeding coating which is not dependent on humidity for its antistatic effect. Further details concerning this antistatic material may be found in Published British Patent Application No. 2,156,362, published Oct. 9, 1985, the disclosure of which is hereby incorporated by reference.

First layer 30 is preferably a polyolefin such as polyethylene (either high or low density, branched or linear) or polypropylene. Additionally, layer 30 may be a copolymer of ethylene or propylene with a copolymerizable monomer. Preferred copolymers include copolymers of ethylene with either vinyl alcohol or vinyl acetate, ethylene-acrylic acid copolymers, and ethylene-carbon monoxide copolymers. Layer 30 may also comprise blends or mixtures of these polyolefin homopolymers and copolymers.

Alternatively, first layer 30 need not be a polyolefin but simply be a heat sealable plastic such as a heat sealable polyester. One example of such a material is polyethylene terephthalate glycol (PETG). Additionally, first layer 30 need not be a single unitary layer but may be comprised of a number of plies as long as the ply adjacent the "Inside" surface of the laminate, i.e., secondary major surface 34 is heat sealable. Thus, it may be desirable to incorporate other polymers having properties such as toughness, resistance to penetration, chemical resistance, or the like into first layer 30. For example, a nylon ply can be incorporated with one or more polyolefin plies to impart additional toughness to layer 30. This nylon ply may be coextruded with a polyethylene ply or otherwise laminated thereto, or alternatively may be sandwiched between two polyethylene plies.

Second layer 38 is formed of a flexible plastic having primary and secondary major surfaces 40 and 42, respectively. Second layer 38 has deposited on its primary major surface 40, a layer of an electrically conductive material 44. The secondary major surface 42 has antistatic properties illustrated by numeral 36'.

Layer 38 is preferably a polyester, but may also be a polyolefin such as polyethylene or polypropylene polymers or copolymers or other polymeric materials. Additionally, layer 38 may comprise blends or mixtures of such polymers, or may include two or more plies of coextruded polymers.

Electrically conductive layer 44 is preferably formed by depositing a thin layer of metal on primary major surface 40 of layer 38. This deposition may be accomplished through the use of conventional vapor deposition or sputtering techniques. Preferred metals include aluminum, stainless steel, nickel, copper, and mixtures thereof. The primary major surface 40 of layer 38 may be pretreated to render it more receptive to metallization. Optionally, electrically conductive layer 44 may be a coated or laminated metal grid, a metal filled plastic film, or other conductive material.

Layer 44, if vacuum deposited or sputtered, is preferably about 50 to about 200 Angstroms thick, and most preferably about 100 Angstroms thick. Its surface resistivity is preferably about 100 ohms/sq. The coating may be discontinuous and/or have pinholes therein with no substantial adverse effect on the Faraday-cage structure which results when the package is formed.

Alternatively, metallized polyester films and sheets are readily commercially available from a number of suppliers and may be utilized in the practice of the present invention. It is preferred that the combination of layers 38, 44, and 30 be partially transparent or transparent to permit visual inspection of the contents of the package without the need for opening the package. Opening of the package outside of a controlled environment which allows for discharge of any static charge buildup may be detrimental. Accordingly, the ability to make a visual inspection of a packaged component, including any part or control numbers included in the package, is desirable. It is also possible to have one wall of the package partially transparent or transparent (through which the component may be inspected) and the other wall opaque. For example a cushioning layer, such as a foamed plastic film, may be laminated to, or included in, wall 12 or 14 while the other wall remains as described. In the preferred embodiment where both walls are transparent, the walls of package 10 are made up of the two principal layers. The two layers 30 and 38 are bonded together along their respective primary major surfaces through the use of an adhesive 46. Adhesive 46 is preferably a thermosetting epoxy or urethane adhesive which is curable by exposure to an electron beam. Further, it is desirable that the adhesive be a solvent-free, 100% solids material; although other forms of adhesive may be used.

Thus, a preferred method of making the multilayer flexible sheet material of the present invention includes the following steps. First layer 30 is coated with antistatic material 36, and the antistatic material is cured by exposure to an electron beam. During this curing step antistatic properties are produced on both major surfaces of layer 30. This phenomenon is discussed in "EB-curable Coating is Clear Cure for Static". *Converting Magazine.* March 1985, and "Electron Beam Radiation Cured Coatings for Static Control," *Evaluation Engineering,* September 1985. That is, surface 34, following curing of antistatic material 36, now shows antistatic properties (illustrated by numeral 36") even though no antistatic material was originally coated directly thereon. Of course, it is possible in an additional step to also coat antistatic material on surface 34.

Second layer 38, with electrically conductive layer 44 thereon, is then joined with layer 30 using adhesive 46. As described above, electrically conductive layer 44 may be deposited on layer 38 by sputtering or vacuum deposition. Alternatively, a metallized plastic which is commercially available may be utilized.

Adhesive 46 may be applied either to electrically conductive layer 44 or antistatic material 36 on layer 30 or both. It is preferably applied by a gravure coating process, although it may be sprayed or otherwise coated using conventional techniques which are suitable for coating 100% solids materials. After application of adhesive 46 and lamination of layers 30 and 38 using pressure rolls or the like, the laminate is again exposed to an electron beam to cure the adhesive. This second curing step causes antistatic properties to appear on the exterior facing surface 42 of layer 38. Surface 42, following curing of the adhesive 46, now shows antistatic properties (illustrated by numeral 36') even though no antistatic material was originally coated directly thereon. Again, it is possible in an additional step to coat antistatic material on surface 42.

In an alternative procedure, antistatic material 36 may be blended with adhesive 46 and applied to one or both layers. Then, a single curing step utilizing an electron beam is performed which cures adhesive 46 and causes antistatic to appear on both the inner and exterior faces of the laminated sheet material; although, as mentioned the results achieved with this alternative procedure are not as good as those achieved with the preferred process.

In order that the invention may be more readily understood, reference is made to the following example, which is intended to illustrate the invention but is not to be taken as limiting the scope thereof.

EXAMPLE

Step #1—Preparation of First Layer 30.

A common insulative low density 2 mil thick polyethylene film is gravure coated on one side with Staticure antistatic electron beam curable coating from Metallized Products to an approximate 0.1 mil thickness. The coated film is immediately passed through an electron beam (Energy Sciences curtain type) at 200 ft./min. and exposed to 3 megarads.

Measurement of surface resistivity according to (ASTM D-257 method) of the uncoated film originally is greater than $10^{14}$ ohms/sq. on both surfaces (insulative).

The surface resistivity after coating and electron beam treatment was measured to be $2.3 \times 10^{11}$ ohms/sq. (inner surface) and $5.5 \times 10^{10}$ ohms/sq. (outer surface).

Step #2—Preparation of Second Layer 38

A one mil polyester (polyethylene terethalate) (mylar) film is coated with aluminum at a controlled density of 100 angstroms resulting in a partially transparent metallized film with surface resistivity of 100 ohms per sq. on the metallized surface and greater than $10^{14}$ ohms per sq. on the non-metallized surface.

Step #3—Preparation of Laminated Flexible Sheet Material

The aluminum side of the polyester is gravure coated to an approximate thickness of 0.1 mil with a thermoset electron beam curable adhesive (epoxy type). The previously coated side of the polyethylene film in step 1 is now brought in contact with the adhesive and both films passed through nip rolls at ambient temperature which feed the two now joined films through an electron beam curtain (3 megarads) at 200 ft./min.

The laminated film structure is wound on a core prior to subsequent conversion. The resultant material is represented in FIG. 3. Surface resistivity measurements [ASTM D-257 method] on the polyester outer surface was measured to be $2 \times 10^{12}$ ohms/sq. The surface resistivity was measured on the inner heat seal surface and found to be $3 \times 10^{12}$ ohms/sq.

Step #4—Preparation of Package 10

The above mentioned film is now placed on an unwind stand for subsequent application of closures on the heat sealable inside surface. The cross section of the final closure is represented schematically in FIG. 2. The film web is threaded through a series of rolls to avoid wrinkles. Low density polyethylene resin previously compounded to contain an antistat agent such as Armostat 350 is extruded through dies designed to result in closures shaped similar to rib element 26 and the other groove element 28 of FIG. 2 and onto the unheated heat seal layer side of the film mentioned.

The web (walls 12 and 14). now containing both rib element 26 and groove element 28 is folded and joined at the closure prior to side seam heat sealing and cutting into bags. Bar type heat seals are utilized for side seam seals with a temperature range of 230° F.-330° F. and packages 10 are severed from the web. No further work is required to the product and it is now ready for use.

Having described the invention in detail and by reference to preferred embodiments thereof, it will be apparent that modifications and variations are possible without departing from the scope of the invention defined in the appended claims.

What is claimed is:

1. A flexible sheet material adaptable for forming a package, bag, pounch, or the like for containing electrostatically sensitive components comprising:
   (a) a first layer of a flexible heat sealable plastic material having primary and secondary major surfaces with antistatic properties on at least said secondary major surface thereof; and
   (b) a second layer of a flexible plastic material having primary and secondary major surfaces with an electrically conductive material on said primary major surface and with antistatic properties on at least said secondary major surface, said first and second layers of material being bonded together along said primary major surfaces, respectively, of said first and second layere.

2. The flexible sheet material of claim 1 further including an antistatic material on said primary major surface of said first layer.

3. The flexible sheet material of claim 2 in which said antistatic material is a cured acrylate monomer-oligomer mixture containing an alkylether triethyl ammonium sulfate.

4. The flexible sheet material of claim 1 in which said first layer is selected from the group consisting of polyethylene, polypropylene, copolymers of ethylene or propylene with a copolymerizable monomer, polyethylene terephthalate glycol and blends or mixtures thereof.

5. The flexible sheet material of claim 1 in which said first layer comprises a plurality of plies of polymeric materials, with at least one of said plies comprising nylon, and with the further proviso that the polymeric material forming said second major surface of said first layer is heat sealable.

6. The flexible sheet material of claim 1 in which said second layer is selected from the group consisting of polyethylene and polypropylene polymers and copolymers, polyester, and blends of mixtures thereof.

7. The flexible sheet material of claim 1 in which said electrically conductive material is a metal selected from the group consisting of aluminum, stainless steel, nickel, copper, and mixtures thereof.

8. The flexible sheet material of claim 1 in which said first and second layers are bonded together with a thermosetting adhesive.

9. The flexible sheet material of claim 8 in which said thermosetting adhesive contains an antistatic material.

10. A package adapted to receive and protect an electrostatically sensitive component, the walls of said package formed of a flexible sheet material comprising:
    (a) a first layer of a flexible heat sealable plastic material having primary and secondary major surfaces with antistatic properties on at least said secondary major surface thereof; and
    (b) a second layer of a flexible plastic material having primary and secondary major surfaces with an electrically conductive material on said primary major surface and with antistatic properties on at least said secondary major surface, said first and second layers of material being bonded together along said primary major surfaces, respectively, of said first and second layers:
    said package being formed by joining together said walls along opposing side edges of facing secondary major surfaces of said first layers of flexible plastic material.

11. The package of claim 10 including releasable, interlocking closure means on opposing inner faces of one end of said walls.

12. The package of claim 11 in which said closure means comprise interlocking rib and groove elements fabricated of a polyolefin polymer which has been treated with an antistatic agent and/or semiconductor filler.

13. The package of claim 10 in which said first layer of said flexible sheet material is selected from the group consisting of polyethylene, polypropylene, copolymers of ethylene or propylene with a copolymerizable monomer, polyethylene terephthalate glycol and blends or mixtures thereof.

14. The package of claim 10 in which said first layer of said flexible sheet material comprise a plurality of plies of polymeric materials, with at least one of said plies comprising nylon, and with the further proviso that the polymeric material forming said second major surface of said first layer is heat sealable.

15. The package of claim 10 in which said second layer of said flexible sheet material is selected from the group consisting of polyethylene and polypropylene polymers and copolymers, polyester, and blends or mixtures thereof.

16. The package of claim 10 further including an antistatic material on said primary major surface of said first layer.

17. The package of claim 16 in which said antistatic material is a cured acrylate monomer-oligomer mixture containing an alkylether triethyl ammonium sulfate.

18. The package of claim 10 in which said electrically conductive material is a metal selected from the group consisting of aluminum, stainless steel, nickel, copper, and mixtures thereof.

19. The package of claim 10 in which said first and second layers of said flexible sheet material are bonded together with a thermosetting adhesive.

20. The package of claim 19 in which said thermosetting adhesive contains an antistatic material and/or semiconductor filler.

21. The flexible sheet material of claim 1 in which said secondary major surface of said first layer and said second layer has a surface conductivity in the range of from about $10^8$ to about $10^{11}$ ohms/sq.

22. The package of claim 10 in which said secondary major surface of said first layer and said second layer has a surface conductivity in the range of from about $10^8$ to about $10^{11}$ ohms/sq.

23. A thermoformed container adapted to receive and protect an electrostatically sensitive component, the walls of said container comprising:
   (a) a first layer of a flexible heat sealable plastic material having primary and secondary major surfaces with antistatic properties on at least said secondary major surface thereof; and
   (b) a second layer of a flexible plastic material having primary and secondary major surfaces with an electrically conductive material on said primary major surface and with antistatic properties on at least said secondary major surface, said first and second layers of material being bonded together along said primary major surfaces, respectively, of said first and second layers.

24. The thermoformed container of claim 23 further including an antistatic material on said first primary major surface of said first layer.

25. The thermoformed container of claim 24 in which said antistatic material is a cured acrylate monomer-oligomer mixture containing an alkylether triethyl ammonium sulfate.

26. The thermoformed container of claim 23 in which said secondary major surfaces of said first layer and said second layer have surface conductivities in the range of from about $10^8$ to about $10^{11}$ ohms/sq.

* * * * *

REEXAMINATION CERTIFICATE (1788th)
United States Patent [19]
Mott

[11] B1 4,756,414

[45] Certificate Issued Sep. 15, 1992

[54] ANTISTATIC SHEET MATERIAL AND PACKAGE

[75] Inventor: Charles L. Mott, Midland, Mich.

[73] Assignee: Minnesota Mining and Manufacturing Comp.

Reexamination Request:
No. 90/002,544, Dec. 13, 1991

Reexamination Certificate for:
Patent No.: 4,756,414
Issued: Jul. 12, 1988
Appl. No.: 785,808
Filed: Oct. 9, 1985

[51] Int. Cl.⁵ .................. B65D 73/02; B65D 81/00
[52] U.S. Cl. ............................ 206/328; 428/922; 428/924
[58] Field of Search ............ 206/328; 428/922, 924

[56] References Cited
U.S. PATENT DOCUMENTS
4,496,406  1/1985  Dedow .......................... 206/328

OTHER PUBLICATIONS
Japanese Patent Publication (Kokoku) No. 38398-89 published Aug. 10, 1984.

*Primary Examiner*—Stephen P. Garbe

[57] ABSTRACT

A flexible sheet material and package formed therefrom is provided. The multilayer sheet material includes a first flexible heat sealable plastic material with antistatic properties on at least the one major surface thereof which first layer is laminated to a second flexible plastic material with an electrically conductive material on the one major surface thereof and antistatic properties on the other major surface thereof.

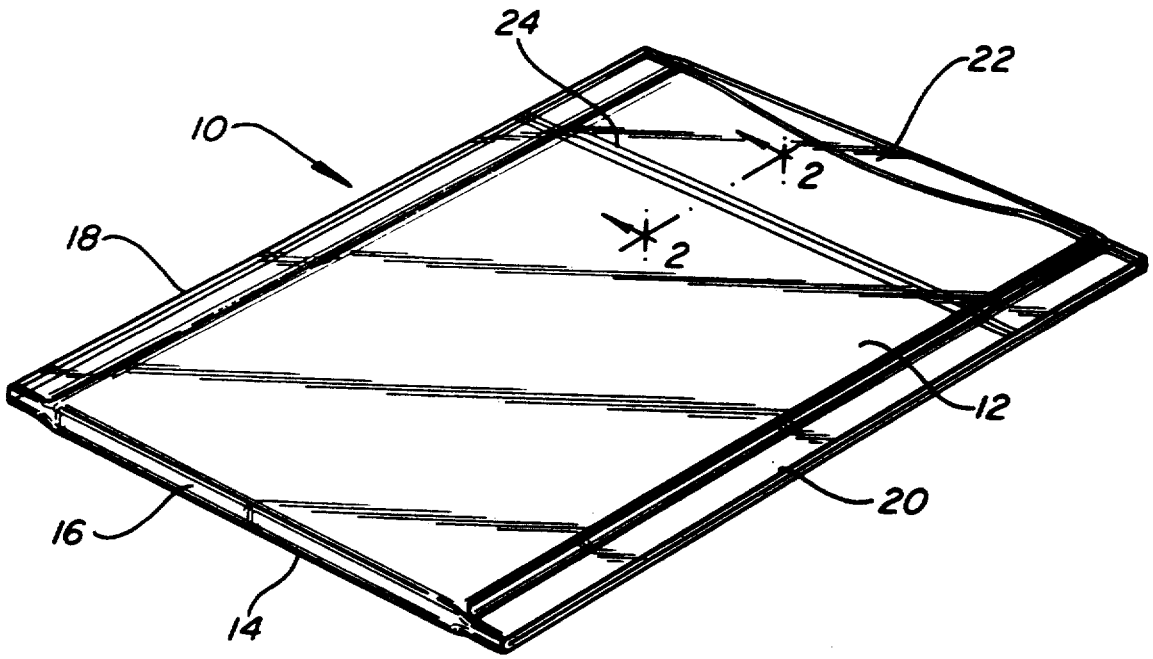

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 8-14 and 23-25 are cancelled.

Claims 2, 4-7, 15, 16, 18, 19, 21, 22 and 26 are determined to be patentable as amended.

Claims 3, 17 and 20 dependent on an amended claim, are determined to be patentable.

New claims 27-37 are added and determined to be patentable.

2. The flexible sheet material of claim [1] *27* further including an antistatic material on said primary major surface of said first layer.

4. The flexible sheet material of claim [1] *27* in which said first layer is selected from the group consisting of polyethylene, polypropylene, copolymers of ethylene or propylene with a copolymerizable monomer, polyethylene terephthalate glycol and blends or mixtures thereof.

5. The flexible sheet material of claim [1] *27* in which said first layer comprises a plurality of plies of polymeric materials, with at least one of said plies comprising nylon, and with the further proviso that the polymeric material forming said second major surface of said first layer is heat sealable.

6. The flexible sheet material of claim [1] *27* in which said second layer is selected from the group consisting of polyethylene and polypropylene polymers and copolymers, polyester, and blends of mixtures thereof.

7. The flexible sheet material of claim [1] *27* in which said electrically conductive material is a metal selected from the group consisting of aluminum, stainless steel, nickel, copper, and mixtures thereof.

15. The package of claim [10] *28* in which said second layer of said flexible sheet material is selected from the group consisting of polyethylene and polypropylene polymers and copolymers, polyester, and blends or mixture thereof.

16. The package of claim [10] *28* further including an antistatic material on said primary major surface of said first layer.

18. The package of claim [10] *28* in which said electrically conductive material is a metal selected from the group consisting of aluminum, stainless steel, nickel, copper, and mixtures thereof.

19. The package of claim [10] *28* in which said first and second layers of said flexible sheet material are bonded together with a thermosetting adhesive.

21. The flexible sheet material of claim [1] *27* in which said secondary major surface of said first layer and said second layer has a surface conductivity in the range of from about $10^8$ to about $10^{11}$ ohms/sq.

22. The package of claim [10] *28* in which said secondary major surface of said first layer and said second layer has a surface conductivity in the range of from about $10^8$ to about $10^{11}$ ohms/sq.

26. The thermoformed container of claim [23] *37* in which said secondary surfaces of said first layer and said second layer have surface conductivities in the range of from about $10^8$ to about $10^{11}$ ohms/sq.

*27. A flexible sheet material adaptable for forming a package, bag, pouch, or the like for containing electrostatically sensitive components comprising:*

*(a) a first layer of a flexible heat sealable plastic material having primary and secondary major surfaces with antistatic properties on at least said secondary major surface thereof;*

*(b) a second layer a flexible plastic material having primary and secondary major surfaces with an electrically conductive material on said primary major surface and with antistatic properties on at least said secondary major surface; and*

*(c) a thermosetting adhesive bonding said first and second layers of material together along said primary major surfaces, respectively, of said first and second layers, said thermosetting adhesive containing an antistatic material.*

*28. A package adapted to receive and protect an electrostatically sensitive component, the walls of said package formed of a flexible sheet material comprising:*

*(a) a first layer of a flexible heat sealable plastic material having primary and secondary major surfaces with antistatic properties on at least said secondary major surface, and*

*(b) a second layer of a flexible plastic material having primary and secondary major surfaces with an electrically conductive material on said primary major surface and with antistatic properties on at least said secondary major surface,*

*said first and second layers of material being bonded together along said primary major surfaces, respectively, of said first and second layers, said first layer comprising a plurality of plies of polymeric materials, with at least one of said plies comprising nylon, and with the further proviso that the polymeric material forming said secondary major surface of said first layer is heat sealable; and*

*said package being formed by joining together said walls along opposing side edges of facing secondary major surfaces of said first layers of flexible plastic material.*

*29. The package of claim 28 including releasable, interlocking closure means on opposing inner faces of one end of said walls.*

30. *The package of claim 28 in which said closure means comprise interlocking rib and groove elements fabricated of a polyolefin polymer which has been treated with an antistatic agent and/or semiconductor filler.*

*31. A flexible sheet material adaptable for forming a package, bag, pouch, or the like for containing electrostatically sensitive components comprising:*

*(a) a first layer of a flexible heat sealable plastic material having primary and secondary major surfaces with antistatic properties on at least said secondary major surface; and*

*(b) a second layer of a flexible plastic material having primary and secondary major surfaces with an electrically conductive material on said primary major sur-* face and with antistatic properties on at least said secondary major surface, said first and second layers of material being bonded together along said primary major surfaces, respectively, of said first and second layers, said first layer comprising a plurality of plies of polymeric materials, with at least one of said plies comprising nylon, and with the further proviso that the polymeric material forming said secondary major surface of said frist layer is heat sealable.

32. The flexible sheet material of claim 31 further including an antistatic material on said primary major sruface of said first layer.

33. The flexible sheet material of claim 1 in which said second layer is selected from the group consisting of polyethylene and polypropylene polymers and copolymers, polyester, and blends of mixtures thereof.

34. The flexible sheet material of claim 31 in which said electrically conductive material is a metal selected from the group consisting of aluminum, stainless steel, nickel, copper, and mixtures thereof.

35. The flexible sheet material of claim 31 in which said first and second layers are bonded together with a thermosetting adhesive.

36. The flexible sheet material of claim 35 in which said thermosetting adhesive contains an antistatic material.

37. A thermoformed container adapted to receive and protect an electrostatically sensitive component, the walls of said container comprising:
  (a) a first layer of a flexible heat sealable plastic material having primary and secondary major surfaces with antistatic properties on at least said secondary major surface; and
  (b) a second layer of a flexible plastic material having primary and secondary major surfaces with an electrically conductive material on said primary major surface and with antistatic properties on at least said secondary major surface, said first and second layers of material being bonded together along said primary major surfaces, respectively, of said first and second layers, said first layer comprising a plurality of plies of polymeric materials, with at least one of said plies comprising nylon, and with the further proviso that the polymeric material forming said secondary major surface of said first layer is heat sealable.

* * * * *